(12) United States Patent
Sonoda et al.

(10) Patent No.: US 6,616,774 B2
(45) Date of Patent: Sep. 9, 2003

(54) WAFER CLEANING DEVICE AND TRAY FOR USE IN WAFER CLEANING DEVICE

(75) Inventors: Haruki Sonoda, Shizuoka-Ken (JP); Kazuto Nishizaki, Shizuoka-Ken (JP); Tetsuji Oishi, Shizuoka-Ken (JP); Masatoshi Hirokawa, Shizuoka-Ken (JP); Ei-Ichi Ando, Shizuoka-Ken (JP); Yusuke Abe, Shizuoka-Ken (JP); Masashi Omori, Shizuoka-Ken (JP)

(73) Assignee: SPC Electronics, Chofu (JP)

( * ) Notice: Subject to any disclaimer, the term of this patent is extended or adjusted under 35 U.S.C. 154(b) by 0 days.

(21) Appl. No.: 09/961,682

(22) Filed: Sep. 24, 2001

(65) Prior Publication Data

US 2002/0066472 A1 Jun. 6, 2002

Related U.S. Application Data

(63) Continuation-in-part of application No. 09/355,544, filed on Jul. 29, 1999, now abandoned.

(30) Foreign Application Priority Data

Dec. 26, 1997 (JP) .............................................. 9-361350
Sep. 4, 1998 (WO) ................................. PCT/JP98/03984

(51) Int. Cl.⁷ ................................................ B08B 7/02
(52) U.S. Cl. ............................... 134/32; 134/2; 134/10; 134/25.1; 134/34; 134/84; 134/85; 134/86; 134/135; 134/137; 134/186; 134/902; 438/906
(58) Field of Search .......................... 134/2, 10, 25.1, 134/32, 34, 135, 137, 164, 84, 85, 86, 186, 902; 438/906

(56) References Cited

U.S. PATENT DOCUMENTS

6,001,191 A  * 12/1999  Kamikawa et al. ........... 134/32
6,050,275 A  *  4/2000  Kamikawa et al. .......... 134/105

FOREIGN PATENT DOCUMENTS

| JP | 4-43639   | * | 2/1992  |
| JP | 7-161677  | * | 5/1993  |
| JP | 6-295896  | * | 10/1994 |
| JP | 5-129267  | * | 6/1995  |
| JP | 7-176506  | * | 7/1995  |
| JP | 7-321079  | * | 12/1995 |
| JP | 9-17762   | * | 1/1997  |

* cited by examiner

Primary Examiner—Randy Gulakowski
Assistant Examiner—M. Kornakov
(74) Attorney, Agent, or Firm—Trop, Pruner & Hu, P.C.

(57) ABSTRACT

There are provided a band-shaped tray 12 having grasping grooves 12a for grasping opposite side ends of wafers 1, and a cleaning tank 20 to which the wafers 1 inserted in the tray 12 are conveyed by a conveyor robot 2 to be cleaned. The cleaning tank 20 is provided with guides 22 for mounting the tray 12 in the tank, a bottom portion 26 formed substantially in V-shape conforming to the bottom-face shape of the wafer 1, and flow ports 24 via which cleaning fluid is supplied into the tank. An outer side face of the cleaning tank 20 is provided with an overflow tank 30 for containing the cleaning fluid overflowing from the cleaning tank 20, and the overflow tank 30 is provided with a circulation line 32 for circulating the cleaning fluid again into the cleaning tank 20.

5 Claims, 4 Drawing Sheets

WAFER CLEANING DEVICE AND TRAY FOR USE IN WAFER CLEANING DEVICE

CROSS-REFERENCE TO RELATED APPLICATION

This is a continuation-in-part of Ser. No. 09/355,544, filed on Jul. 29, 1999, now abandoned.

TECHNICAL FIELD

The present invention relates to a wafer cleaning device and a tray for use in the wafer cleaning device, particularly to a wafer cleaning device in which a tray containing wafers is steeped in a cleaning tank and cleaning fluid is allowed to flow to clean the wafers and to a tray for use in the wafer cleaning device.

BACKGROUND ART

In a conventional method of manufacturing semiconductor wafers, a cleaning process is performed to rinse the surfaces of semiconductor wafers (hereinafter referred to as wafers) in chemical liquid, pure water or another cleaning fluid. A wafer cleaning device and a tray for use in the wafer cleaning device are used in the process. To maintain the performance and reliability of wafers, the wafer cleaning device and the tray are requested to have a high cleaning capability to reduce contaminant substances adhering to the surfaces of the wafers. Especially, in a large wafer having a diameter of 12 inches (300 mm), the cleaning effect is largely changed by the flow of the cleaning fluid to be supplied to the cleaning tank, the tray for conveying the wafers, or other conditions. Moreover, for the large wafer, since the amount of cleaning fluid for use in cleaning is also increased, the capacity of the cleaning tank is one of important factors. To solve the problems, various wafer cleaning devices and trays for use in the wafer cleaning devices have been developed.

FIG. 3 is a perspective view showing a conventional wafer cleaning device. Moreover, FIG. 4 is a sectional view showing a section taken along line B—B in FIG. 3.

As shown in FIG. 3, the conventional wafer cleaning device is constituted of a cleaning tank 50 for housing and cleaning wafers 40 conveyed by a conveyor robot 42, and a mounting base 52 onto which the wafers 40 conveyed by the conveyor robot 42 are arranged and mounted on the bottom of the cleaning tank 50.

When the wafer cleaning device constituted as aforementioned is used, a plurality of arranged wafers 40 are a grasped by the conveyor robot 42 in a predetermined process and conveyed to an upper part of the cleaning tank 50. After the wafers 40 are conveyed to above the cleaning tank 50, the conveyor robot 42 moves down to mount a plurality of wafers 40 onto the mounting base 52 of the cleantng tank 50. After the wafers 40 are mounted, the cleaning fluid is allowed to flow via a flow port (not shown) provided in the bottom of the cleaning tank 50, so that the wafers 40 are cleaned by the flow.

According to the wafer cleaning device constituted as described above, since the wafers 40 are constantly cleaned by the cleaning fluid when the conveyor robot 42 mounts and takes out the wafers, the wafers 40 are not contaminated by the conveyor robot 42.

In the structure of the wafer cleaning device, however, as shown in FIG. 4, a space H in which the conveyor robot 42 is steeped is necessary between the side face of the wafer 40 and the side wall of the cleaning tank 50. Therefore, as the cleaning tank is enlarged, the amount of cleaning fluid for use is also increased. Moreover, for the mounting base 52 provided on the bottom of the cleaning tank 50, the contaminant substances peeled off the wafers 40 by cleaning are deposited to disadvantageously re-contaminate newly mounted wafers. To solve the problem, there is proposed a wafer cleaning device in which wafers are housed in a tray for cleaning.

FIG. 5 is a perspective view showing such conventional wafer cleaning device and a tray for use in the wafer cleaning device. Moreover, FIG. 6 is a sectional view showing a section taken along line C—C shown in FIG. 5.

As shown in FIG. 5, in the conventional wafer cleaning device and the tray for use in the wafer cleaning device, there are provided a tray 70 formed substantially in a box shape having opened top and bottom ends for containing inside a plurality of vertically arranged wafers 60, and a cleaning tank 80 for cleaning the wafers 60 in the tray 70 conveyed by a conveyor robot 62.

When the wafer cleaning device and the tray for use in the wafer cleaning device constituted as described above are used, in a predetermined process, a plurality of wafers 60 are inserted in the tray 70, and the tray 70 is grasped and conveyed to above the cleaning tank 80 by the conveyor robot 62. After the conveyor robot 62 conveys the wafers 60 to above the cleaning tank 80, the conveyor robot 62 moves down to mount the tray 70 onto the bottom of the cleaning tank 80. After the tray 70 is mounted, the cleaning fluid is allowed to flow via a flow port (not shown) provided in the bottom of the cleaning tank 80, so that the wafers 60 are cleaned by the flow.

According to the wafer cleaning device and the tray for use in the wafer cleaning device, as shown in FIG. 6, a space in which the conveyor robot 62 is steeped is unnecessary between the side face of the tray 70 and the side wall of the cleaning tank 80. By eliminating the space, the cleaning tank 80 can be miniaturized. Moreover, after cleaning is completed, the tray 70 containing the wafers 60 is removed from the cleaning tank 80, and kept constantly in a clean state, so that the wafers 60 fail to be contaminated.

In this manner, cleaning is effectively performed by preventing the wafers from being contaminated in the conventional wafer cleaning device and the tray for use in the wafer cleaning device.

However, in the conventional wafer cleaning device and the tray for use in the wafer cleaning device, since the fluid resistance of the cleaning fluid is enlarged inside the tray 70 shown in FIG. 5, the flow rate of the cleaning fluid is relatively decreased in the vicinity of the wafers. Therefore, to secure a constant flow rate necessary for the cleaning of wafers, a high flow rate is necessary in whole, and the amount of cleaning fluid for use is also disadvantageously increased.

Moreover, in the conventional wafer cleaning device and the tray for use in the wafer cleaning device, a grasping portion by which the wafers are grasped has a large contact area abutting on the wafers in the tray, and a probability of contaminating the wafers by particles and other contaminant substances is high. There is a disadvantage that the particles and other contaminant substances adversely affect production yield and remarkably deteriorate product quality.

An object of the present invention is to solve the problem described above and to provide a wafer cleaning device which prevents the contamination of wafers and which can effectively clean the wafers and a tray for use in the wafer cleaning device.

DISCLOSURE OF THE INVENTION

To solve the problem described above, the present invention provides a wafer cleaning device in which a plurality of wafers arranged at predetermined intervals are housed in a cleaning tank and cleaning fluid is supplied from a bottom face to clean the wafers. There is provided a tray which comprises grasping grooves formed in a band-shaped peripheral wall surrounding an outer periphery of the plurality of arranged wafers to expose upper and lower portions of the wafers for grasping opposite side ends of the arranged wafers and grasping portions by which the peripheral wall is conveyed. There is also provided a cleaning tank which comprises a guide for holding the tray in a predetermined position, a bottom face formed conforming to a bottom-face shape of the wafer, and a flow port for allowing the cleaning fluid to flow between the bottom face and wafer bottom faces.

Here, the bottom portion of the cleaning tank is formed substantially in a V-shape conforming to the bottom-face shape of the wafer, and inclined at an angle of 24 degrees relative to a horizontal plane. Moreover, the cleaning tank is further provided, on an outer side face, with an overflow tank to which the cleaning fluid overflows. The overflow tank is further provided with a circulation means for circulating overflown cleaning fluid again into the cleaning tank to change the flow rate of the cleaning fluid flowing via the flow port of the cleaning tank.

Moreover, there is provided a tray for use in a wafer cleaning device in which a plurality of wafers are arranged at predetermined intervals, conveyed into a cleaning tank of the wafer cleaning device by a conveying means, and cleaned. The tray comprises a band-shaped-peripheral wall surrounding an outer periphery of a plurality of arranged wafers to expose upper and lower portions of the wafers; grasping grooves formed in the peripheral wall for grasping opposite side ends of the wafers; an engaging portion for mounting the peripheral wall at a predetermined height from a bottom face of the cleaning tank; and grasping portions of the conveying means extended upward from front and back peripheral walls of the arranged wafers.

BEST MODE FOR CARRYING OUT THE INVENTION

Figure 1:
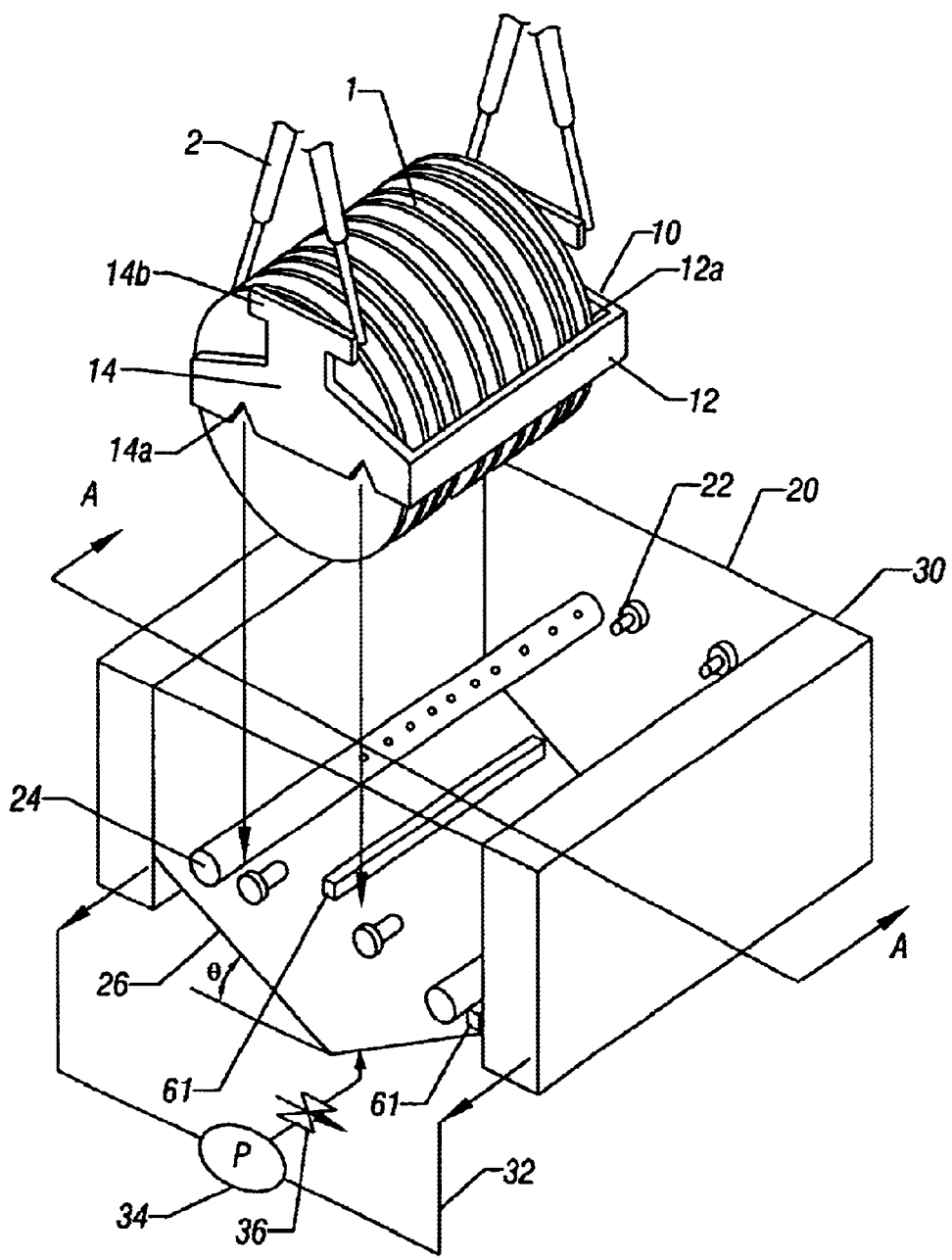
FIG. 1 is a perspective view showing an embodiment of a wafer cleaning device and a tray for use in the wafer cleaning device according to the present invention.
Figure 2:
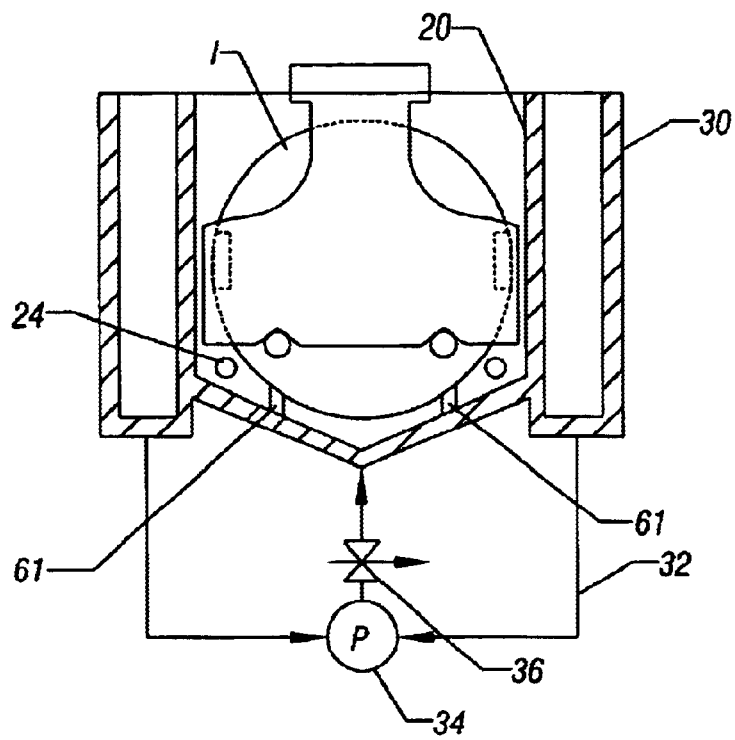
FIG. 2 is a sectional view showing a section taken along line A—A shown in FIG. 1.
Figure 3:
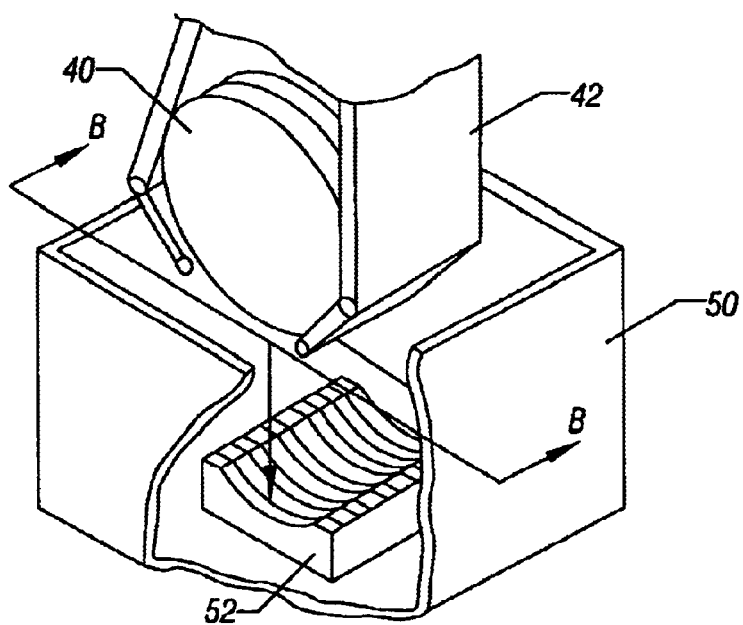
FIG. 3 is a perspective view showing a conventional wafer cleaning device.
Figure 4:
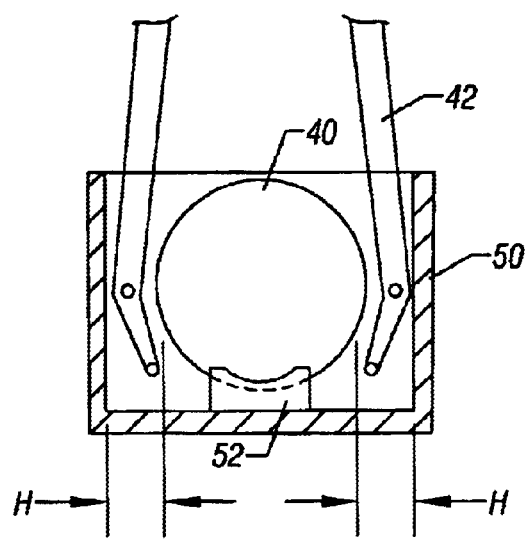
FIG. 4 is a sectional view showing a section taken along line B—B shown in FIG. 3.
Figure 5:
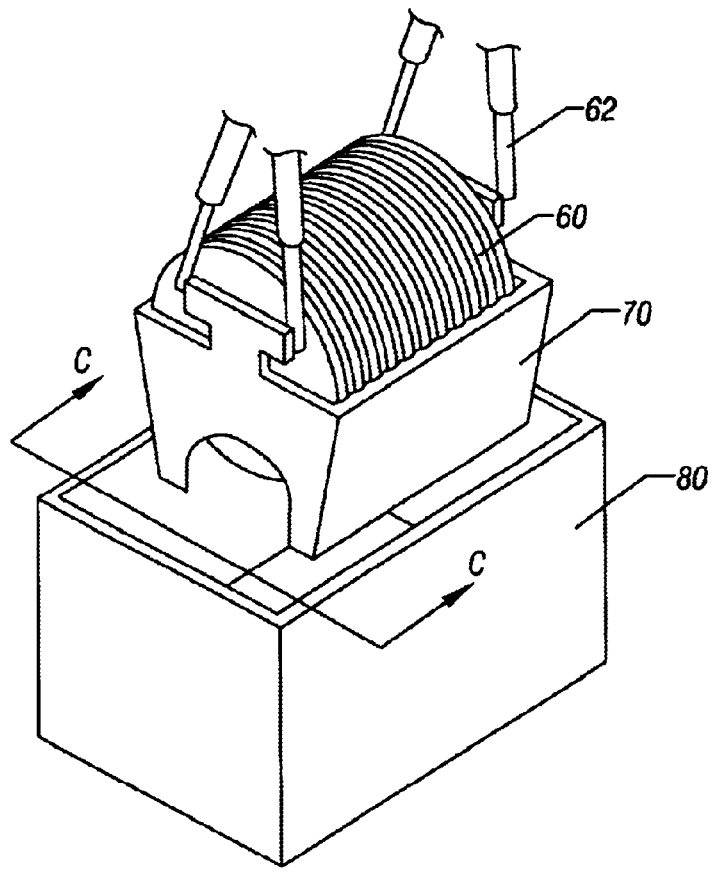
FIG. 5 is a perspective view showing a conventional wafer cleaning device and a tray for use in the wafer cleaning device.
Figure 6:
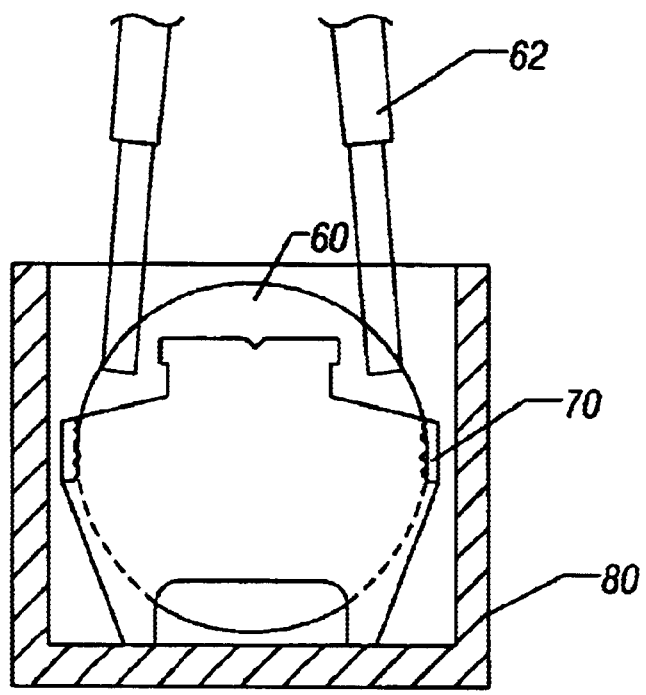
FIG. 6 is a sectional view showing a section taken along line C—C shown in FIG. 5.

An embodiment of a wafer cleaning device and a tray for use in the wafer cleaning device according to the present invention will be hereinafter described in detail. FIG. 1 is a perspective view showing the embodiment of the wafer cleaning device and the tray for use in the wafer cleaning device according to the present invention. Moreover, FIG. 2 is a sectional view showing a section taken along line A—A shown in FIG. 1.

As shown in FIG. 1, in the embodiment of the wafer cleaning device and the tray for use in the wafer cleaning device according to the present invention, there are provided a tray 10 in which a plurality of wafers 1 are vertically inserted and their opposite ends are grasped and held, and a cleaning tank 20 for cleaning the wafers 1 in the tray 10 conveyed by a conveyor robot 2.

Here, the tray 10 has a band-shaped peripheral wall surrounding an outer periphery of a plurality of arranged wafers 1 in such a manner that upper and lower portions of the wafers can be exposed. The peripheral wall has side walls 12 extending in parallel with an arrangement direction of the wafers 1 and connecting walls 14 for connecting opposite ends of the side walls 12. The side walls 12 are provided with grasping grooves 12a for grasping opposite side ends of the plurality of arranged wafers 1. On the other hand, engaging portions 14a are formed by partially cutting away a bottom of the connecting wall 14. The connecting wall 14 is also provided with a vertically extended grasping portion 14b, which can be grasped and conveyed by the conveyor robot 2.

In this manner, the tray 10 containing the wafers 1 is configured in such a manner that the peripheral wall is formed in a band shape to expose the upper and lower portions of the contained wafers 1 and the grasping portions of the wafers 1 are formed small. By reducing the area abutting on the wafers 1, the wafers 1 are prevented from being contaminated by the tray 10, while the cleaning fluid effectively flows.

On the other hand, the cleaning tank 20 houses the tray 10 conveyed by the conveyor robot 2, and has guides 22 for installing the tray 10 at a predetermine height. The guides 22 are formed in convex shapes such that they are perpendicularly protruded from an inner side wall of the cleaning tank 20 to engage with the engaging portions 14a. Here, the grasping portions 14b of the tray 10 mounted on the guides 22 of the cleaning tank 20 are protruded upward from the cleaning tank 20. Thereby, the conveyor robot 2 can mount the tray 10 from the outside of the cleaning tank 20. Therefore, since a space for the conveyor robot 2 is unnecessary in the cleaning tank 20, the device can be miniaturized.

Furthermore, the cleaning tank 20 has a bottom portion 26 formed by inclining a bottom face substantially in a V-shape. Here, the bottom portion 26 of the cleaning tank inclined substantially in V-shape is preferably inclined by an angle $\theta$ of 24 degrees relative to a horizontal plane. Additionally, in the cleaning tank 20, flow ports 24 via which the cleaning fluid flows are formed in the vicinity of the bottom portion 26.

In the embodiment, as shown in FIG. 2, since a space between the outer periphery of the wafers 1 and the inner face of the cleaning tank 20 is formed narrow, the cleaning fluid supplied via the flow ports 24 efficiently flows entirely through the wafers 1.

Furthermore, an overflow tank 30 is provided on an outer side face of the cleaning tank 20 for containing the cleaning fluid overflowing from the cleaning tank 20. A pump 34 and a circulation line 32 are connected to the overflow tank 30 to circulate the cleaning fluid flowing from the cleaning tank 20 again in the cleaning tank 20. Moreover, a valve 36 for adjusting the amount of the cleaning fluid to be drained to the cleaning tank 20 is attached to the circulation line 32 connected to the cleaning tank 20 via the pump 34.

When the wafer cleaning device and the tray for use in the wafer cleaning device constituted as aforementioned are used, first, in a predetermine process, a plurality of wafers 1 are inserted into the tray 10, and the grasping portions 14b are grasped and conveyed to the cleaning tank 20 by the conveyor robot 2. When the tray 10 is conveyed to above the cleaning tank 20, the conveyor robot 2 moves down to mount the engaging portions 14a of the tray 10 onto the guides 22 in the cleaning tank 20.

When the tray 10 is mounted onto the guides 22, the cleaning fluid is supplied via the flow ports 24 formed in the vicinity of the bottom portion 26 of the cleaning tank 20. The cleaning fluid flows along the inner face of the cleaning tank 20 via the flow ports 24, while the wafers 1 are cleaned by the flow.

At this time, the cleaning fluid flowing in the cleaning tank 20 overflows to the overflow tank 30 from the upper part of the cleaning tank 20. The cleaning fluid contained in the overflow tank 30 is drained back into the cleaning tank 20 via the circulation line 32 by the pump 34.

Here, when the cleaning fluid is drained into the cleaning tank 20, it is drained into the cleaning tank 20 by adjusting the flow rate of the cleaning fluid by the valve 36. By changing the flow rate of the cleaning fluid by the valve 36 in this manner, the wafers 1 can effectively be cleaned.

Here, to clean the wafers 1, an elevating member for elevating the wafers 1 slightly upward from the bottom portion 26 of the cleaning tank 20 is disposed to easily clean the side ends of the wafers 1 grasped in the grasping grooves 12a of the tray 10, so that the wafers 1 slightly floated are cleaned.

As aforementioned, according to the embodiment, the cleaning fluid can effectively flow, while the contamination of the wafers 1 can be prevented. Therefore, different from the conventional wafer cleaning device, the cleaning fluid is prevented from being wasted, and the influence on the production yield by the re-contamination of the wafers is reduced.

The embodiment of the wafer cleaning device and the tray for use in the wafer cleaning device developed according to the present invention has been described above in detail, but the present invention is not limited to the embodiment and can be varied within a range not departing from the scope.

For example, the present invention is not limited to the circulation structure by the pump and the valve disposed in the overflow tank, and a filter or another filtering device via which the cleaning fluid to be drained into the cleaning tank can be filtered may be provided.

Moreover, the embodiment in which the bottom face of the cleaning tank is formed substantially in V-shape has been described, but the present invention is not limited to the embodiment. For example, the bottom face may be formed substantially in a semicircular shape conforming to the shape of the wafer.

Furthermore, the embodiment in which the grasping portions are protruded from the cleaning tank when the tray is mounted in the cleaning tank has been described, but the present invention is not limited to the embodiment. For example, the grasping portions may be steeped in the cleaning tank to clean the wafers together with the conveyor robot.

Possibility of Industrial Utilization

According to the wafer cleaning device and the tray for use in the wafer cleaning device of the present invention, since the bottom face of the cleaning tank is formed substantially in V-shape, the amount of the cleaning fluid contained in the cleaning tank is reduced as compared with the conventional device. The cleaning fluid is prevented from being wasted, and effectively used. Additionally, since the upper and lower portions of the wafers inserted in the tray are exposed, the cleaning fluid effectively flows over the entire surfaces of the wafers, so that a high cleaning effect can be obtained.

Moreover, since the contact area abutting on wafers is reduced by forming the tray containing the wafers in a small band shape, the tray can be prevented from contaminating the wafers by particles and other contaminant substances.

When the tray is mounted onto the guides 22, elevating members 61 make all the wafers in the tray lift a little (a few mm) uniformly. These elevating members 61 are fixed onto the bottom portion 26 of the cleaning tank.

Furthermore, according to the present embodiment, these two elevating members 61 receive the wafers at both lower sides of the wafers. Alternatively, an elevating member may be fixed at the center of the bottom portion 26 of the cleaning tank, or three or more elevating members including members fixed at the center or both lower sides of the wafers can be fixed.

What is claimed is:

1. A method for wafer cleaning comprising:

arranging a plurality of wafers, each having two opposing sides and a top and a bottom face, and seating the wafers in grasping grooves on a band-shaped tray such that each of the two opposing sides of each wafer are grasped by respective grasping grooves;

placing the band-shaped tray and arranged wafers into a cleaning tank having a bottom face generally conforming to a bottom-faced shape of a wafer;

placing the band-shaped tray onto a guide fixing the tray at a predetermined position in the cleaning tank;

flowing cleaning fluid at a flow rate from the bottom face of the cleaning tank over the bottom and top faces of each wafer;

elevating the wafers slightly upward from the bottom face of the cleaning tank thereby exposing a portion of opposing sides of each wafer that were grasped in the grasping grooves to the cleaning fluid;

returning each wafer back to a seated position in the grasping grooves; and removing the plurality of wafers from the cleaning tank.

2. The method as in claim 1 wherein the wafers are cleaned utilizing a cleaning tank with a substantially V-shaped bottom face.

3. The method as in claim 2 wherein the wafers are cleaned utilizing a cleaning tank with a V-shaped bottom face where each of the sides of the V-shape is inclined at an angle of about 24 degrees relative to a horizontal plane.

4. The method as in claim 1 wherein the wafers are cleaned utilizing a cleaning tank having an overflow tank on an outer side face of the cleaning tank.

5. The method as in claim 4 wherein the wafers are cleaned utilizing a cleaning tank that includes a circulation means for circulating any overflown cleaning fluid into the cleaning tank to reduce the flow rate of fresh cleaning fluid.

* * * * *